(12) United States Patent
Bliss et al.

(10) Patent No.: US 8,073,083 B2
(45) Date of Patent: Dec. 6, 2011

(54) SLIDING BLOCK TRACEBACK DECODING OF BLOCK CODES

(75) Inventors: William Gene Bliss, Thornton, CO (US); Arthur Abnous, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 890 days.

(21) Appl. No.: 12/111,852

(22) Filed: Apr. 29, 2008

(65) Prior Publication Data

US 2008/0267323 A1    Oct. 30, 2008

Related U.S. Application Data

(60) Provisional application No. 61/124,794, filed on Apr. 30, 2007.

(51) Int. Cl.
*H04L 27/06* (2006.01)

(52) U.S. Cl. ........ 375/341; 375/362; 714/786; 714/794; 714/795

(58) Field of Classification Search .................. 375/341, 375/262; 714/786, 794, 795
See application file for complete search history.

(56) References Cited

U.S. PATENT DOCUMENTS

| | | | | |
|---|---|---|---|---|
| 6,185,173 B1 * | 2/2001 | Livingston et al. | ........ | 369/59.21 |
| 6,553,541 B1 * | 4/2003 | Nikolic et al. | ................ | 714/795 |
| 6,754,290 B1 * | 6/2004 | Halter | ............. | 375/340 |
| 6,813,743 B1 * | 11/2004 | Eidson | ............ | 714/795 |
| 6,980,605 B2 * | 12/2005 | Gatherer et al. | ............ | 375/340 |
| 7,200,799 B2 * | 4/2007 | Wang et al. | ................... | 714/795 |
| 7,480,852 B2 * | 1/2009 | Hedayat et al. | ............... | 714/794 |
| 2004/0081074 A1 * | 4/2004 | Piechocki | ...................... | 370/206 |
| 2007/0174757 A1 * | 7/2007 | Gho et al. | ...................... | 714/795 |
| 2007/0205921 A1 * | 9/2007 | Sawitzki | .......................... | 341/50 |
| 2008/0104488 A1 * | 5/2008 | Cheng | ............................ | 714/794 |
| 2008/0123781 A1 * | 5/2008 | Pisek et al. | ...................... | 375/340 |

OTHER PUBLICATIONS

Black, "A 1-Gb/s, four-state, sliding block Viterbi decoder, "IEEE Journal of Solid-State Circuits, vol. 32 , Issue: 6,3 Publication Year: 1997 , pp. 797-805.*

* cited by examiner

*Primary Examiner* — Juan A Torres

(74) *Attorney, Agent, or Firm* — Garlick Harrison & Markison; Robert A. McLauchlan, III

(57) ABSTRACT

Sliding block traceback decoding of block codes. Block by block basis decoding is performed in which a single block, and its corresponding overlap portion, are processed during a given time. The traceback saves a record of decision (e.g., among possible trellis branches between various trellis stages) and constructs only the surviving paths through each individual block. Since only one block (by also employing its corresponding overlap portion) is decoded per time, the traceback through the coded block signal is short. One block of the coded block signal is decoded at a time, and certain resulting information (e.g., bit estimates and/or states) of a first decoded block can be leveraged when decoding a second/adjacent block.

20 Claims, 15 Drawing Sheets

SLIDING BLOCK TRACEBACK DECODING OF BLOCK CODES

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application:

1. U.S. Provisional Application Ser. No. 61/124,794, entitled "Sliding block traceback decoding of block codes," filed Apr. 30, 2007.

BACKGROUND OF THE INVENTION

1. Technical Field of the Invention

The invention relates generally to decoding of signals within communication systems; and, more particularly, it relates to trellis decoding of signals that involve performing traceback of at least one surviving path within a block.

2. Description of Related Art

Data communication systems have been under continual development for many years. One such type of communication system that has been of significant interest lately is a communication system that employs iterative error correction codes. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

As is known, many varieties of memory storage devices (e.g. hard disk drives (HDDs)), such as magnetic disk drives are used to provide data storage for a host device, either directly, or through a network such as a storage area network (SAN) or network attached storage (NAS). Such a memory storage system (e.g., a HDD) can itself be viewed as a communication system in which information is encoded and provided via a communication channel to a storage media; the reverse direction of communication is also performed in a HDD in which data is read from the media and passed through the communication channel (e.g., sometimes referred to as a read channel in the HDD context) at which point it is decoded to makes estimates of the information that is read.

Typical host devices include stand alone computer systems such as a desktop or laptop computer, enterprise storage devices such as servers, storage arrays such as a redundant array of independent disks (RAID) arrays, storage routers, storage switches and storage directors, and other consumer devices such as video game systems and digital video recorders. These devices provide high storage capacity in a cost effective manner.

Of the many types of communication systems that have received interest in recent years, many of them undesirably introduce some degree of ISI (Inter-Symbol Interference) to signal transmitted therein. The read (and write) channel of a hard disk drive (HDD) (which can itself be viewed as being a communication channel within a communication system) is one such communication channel that oftentimes introduces ISI. One solution to address and combat the undesirable effects of ISI is to employ some form of error correction code (ECC) to encode information being passed through such a communication channel that may undesirably suffer from ISI.

For example, such encoding (e.g., in accordance with an ECC) may be performed in many steps and such encoding steps may vary from device to device. The encoding steps include, but are not limited to, addition of a preamble (bits pre-pended to the data unit (e.g., a data sector) to facilitate determination of the phase of the analog data signal from the disc), a sync mark (bits placed between the preamble and encoded user data to identify the start of the encoded user data), modulation coding (any scheme that makes the user data easier to read by the reading mechanism of the device; this type of encoding "transforms" the bit sequence, often making it substantially different in appearance from the original user data), and error correction coding (bits appended to the encoded user data that allows correction of some limited number of errors that may have occurred during retrieval). The main point is that several common (but variable) procedures are invoked to improve the robustness and readability of the data stored in the device.

Within such hard disk drives (HDDs), disk drive controllers control the various processes associated with the read/write of data to the physical media. As the amount of data stored to the physical media increases, the ability accurately to read data from the physical media is adversely effected. Again, one factor affecting the ability to accurately read this data is ISI (Inter-Symbol Interference). Although discussed here as a problem associated with HDDs, this problem may be present within any communication channel (as also stated above).

To allow higher storage within physical media such as that of a hard disk drive (HDD), one solution in telecommunications and data storage has been to intentionally write symbols close together and utilize the Viterbi algorithm (or any other sequence detector) and knowledge of how the symbols interact to recover the bit sequence from a noisy analog signal. When applying this solution, the data interferes in a controlled manner and additionally becomes distorted by noise and/or other interfering signals. This noise and interfering signals must be overcome in order to properly read back the pattern of "1's" and "0's" correctly. The Viterbi algorithm is an efficient dynamic programming algorithm that finds the most likely sequence of bits received by comparing a received sequence of points sampled from the analog read back waveform to every possible sequence of bits transmitted. This best sequence is referred to as the "best path through the trellis." The trellis tracks all possible paths and consists of states, which help track the bit decisions associated with the path through them. Other techniques design symbols that are more robust against ISI. Decreasing the symbol rate (e.g., the "baud rate"), and keeping the data bit rate constant (by coding more bits per symbol), reduces ISI.

A sizable market has developed for these data storage devices and the price per unit of storage has steadily dropped. A similar market has developed for high capacity communication channels. As increased capacity within communication channels and data storage devices are provided, the need to retrieve data from these communication channels and data storage devices with greater accuracy continues to grow.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
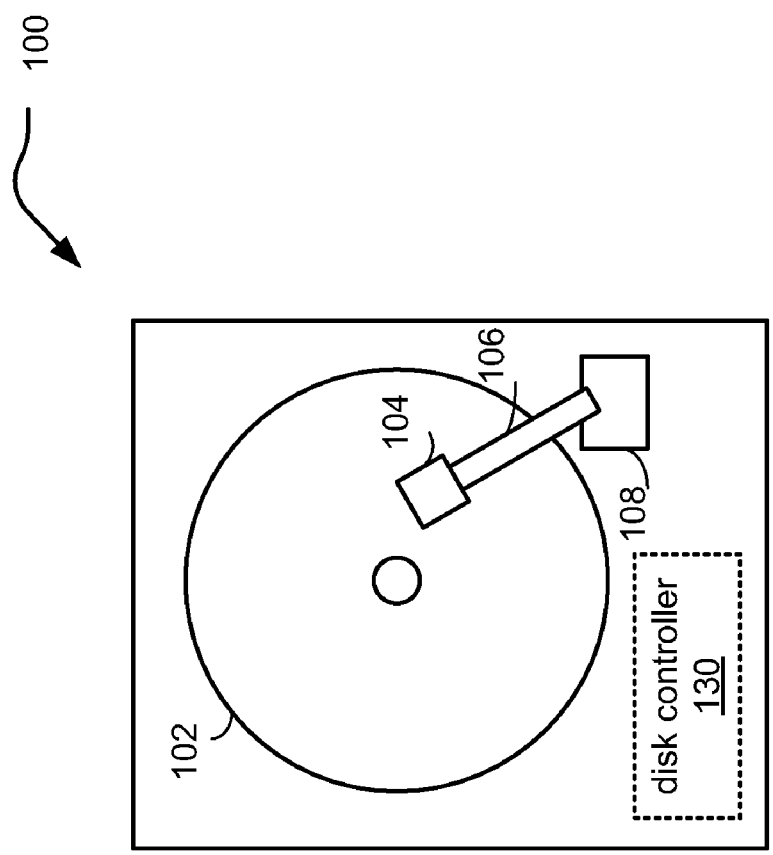
FIG. 1 illustrates an embodiment of a disk drive unit.

A novel approach is presented herein that is operable to perform sliding traceback decoding of a block coded signal. Various embodiments of apparatus and methods are described in which the decoding of a singular block at a time, using a sliding block, that passes over a multi-block coded signal. In contradistinction to the prior art approaches of decoding block coded signals, in which no sliding block is employed whatsoever, and in which a much larger amount of information needs to be processed to make any estimates of information encoded within the multiple blocks, the means presented herein can be implemented to decode only one block at a time (e.g., by processing a block and its corresponding overlap portion at a time). The estimates of a first block are then generated and output before or while a second block and its corresponding overlap portion are processed.

Using the sliding block mechanism presented herein, the decoding advances through the block coded signal by a relatively smaller amount at each time that in accordance with prior art decoding approaches. The traceback through any portion of the signal being decoding in accordance with the novel means of sliding block traceback decoding presented herein is much less than that required and employed using in accordance with prior art decoding approaches. The decoded/known state values at block boundaries/transitions is employed also to leverage the novel means of sliding block traceback decoding presented herein.

Embodiments of the present invention provide a means that reduces memory and power requirements by making a definitive statement regarding a bit sequence to improve the performance of any sequence detector, such as but not limited to a Viterbi Algorithm, a "Soft-Output Viterbi Algorithm (SOVA)" or Bahl, Cocke, Jelinek, and Raviv (BCJR) detector. This improved performance results by constraining the sequence detector when the sequence detector has past a survivor length.

One set of embodiments of the present invention provides a method to control ISI (or more generally, overcome noise and interference) in order to allow greater storage capacity at reduced cost within physical media such as that within a variety of data storage devices (e.g. disk drives, floppy drives, hard disk drive (HDD), and optical drives including CD, DVD, and Blu-Ray). This method involves reading an analog waveform from the physical media. The phase of this analog waveform is determined and the analog waveform is sampled at regular intervals using a timing recovery scheme. This sample sequence is equalized (filtered) and sent to a sequence detector which compares the received sequence to all possible transmitted sequences, generating a path through a trellis that represents the estimated sequence. That trellis path may pass through known states at certain times. For example, the known bit sequence may include a preamble, synchronization (sync) mark, data, and post-amble. Additionally, the history of decisions may be examined to make a definitive statement regarding the trellis path. Fundamentally the current state is unknown. However for each possibility, if one examines each possibility, the trellis paths will converge in the past. The length taken for these trellis paths to converge is known as the survivor length. Knowledge of the ideal or actual bit sequences at certain time instances makes it possible to remove some of the trellis paths under consideration, hence improving performance of the sequence detector. Any disallowed bit sequences (i.e. trellis paths) may be pruned from the set of possible bit sequences based on knowledge of the ideal or actual bit sequence. Then the sample sequence may be compared to a set of possible bit sequences to select a decoded bit sequence. Embodiments of the present invention allow for the trellis paths outside the survivor length to be pruned from the set of possible bit sequences to reduce both memory and power requirements. The trellis paths outside the survivor length may be pruned using either a sliding block process or chunk process.

A Viterbi algorithm may be used to determine a forward path through a trellis. This is used to determine in the case of a hard drive, a bit sequence. After the Viterbi algorithm has processed the data the best estimate of the data is the forward path through the trellis. All other paths that have been considered are essentially nuisance variables that have been created in the search for the final digital output. This situation imposes significant problems where long runs of data are involved. The large number of paths require additional memory and power resources. Additionally, in many applications it is desirable to have reduced latency. This reduced latency may require that the entire data set is recovered. For example, it may be desirable to wait only five constraint lengths of the trellis to determine the best path at that time for timing loop needs.

Looking at a chain of decisions, to increase the reliability of the system one must examine the history and determine where a reliable decision may be identified. The length to this reliable or definite decision is typically called a survival length L. The survival length is how far back one must look back in the trellis to make a definitive statement about the trellis. The main reason for the ability to make this definitive statement is that in the present the current time state is unknown. The possibilities for the current state are known and each link to a chain of potential decisions, wherein these chains begin to converge at about the survival length.

FIG. 1 illustrates an embodiment of a disk drive unit 100. In particular, disk drive unit 100 includes a disk 102 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 102 can be a magnetic disk that stores information as magnetic field changes on some type of magnetic medium. The medium can be a rigid or non-rigid, removable or non-removable, that consists of or is coated with magnetic material.

Disk drive unit 100 further includes one or more read/write heads 104 that are coupled to arm 106 that is moved by actuator 108 over the surface of the disk 102 either by translation, rotation or both. A disk controller 130 is included for controlling the read and write operations to and from the drive, for controlling the speed of the servo motor and the motion of actuator 108, and for providing an interface to and from the host device.

Figure 2:
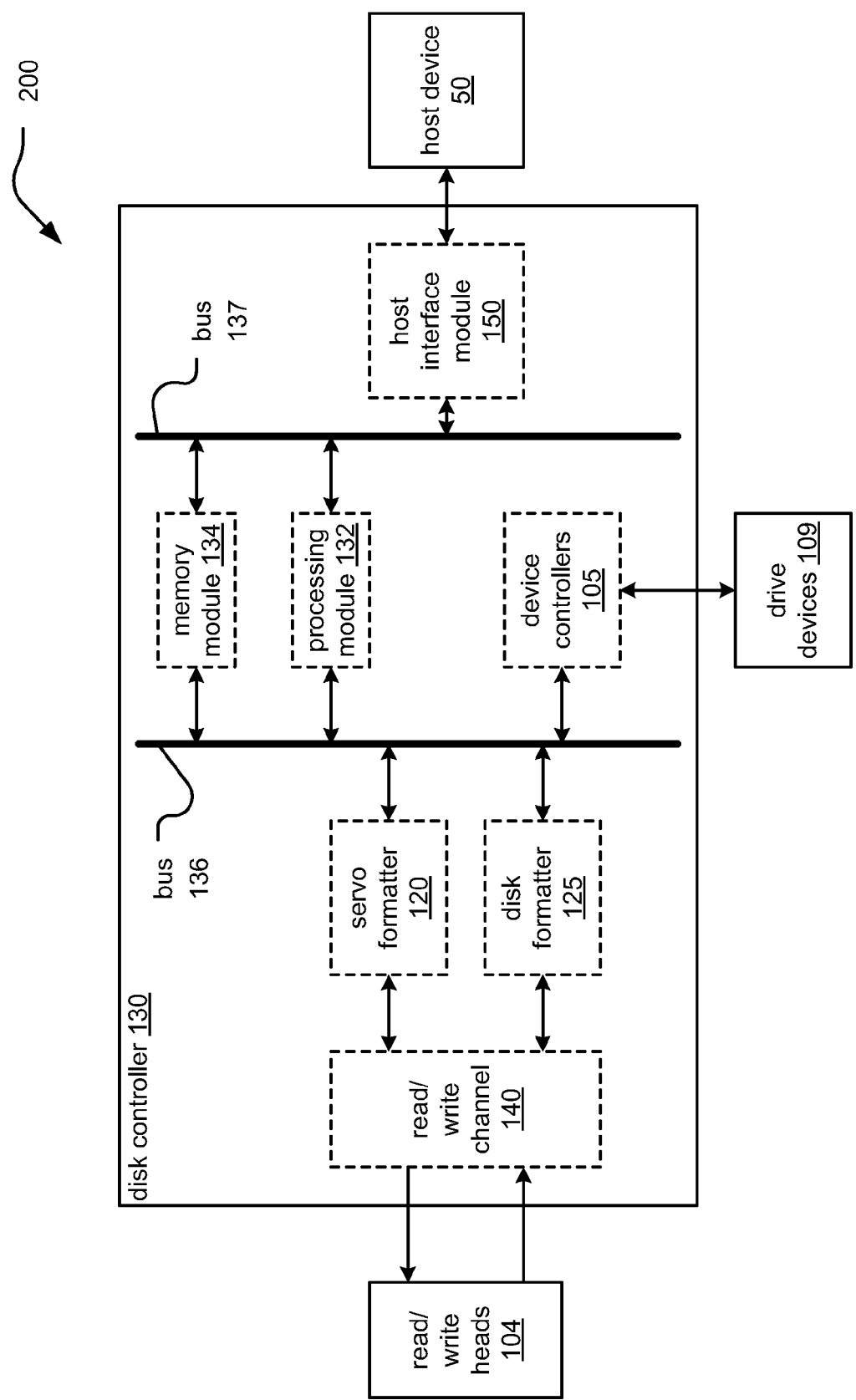
FIG. 2 illustrates an embodiment of an apparatus that includes a disk controller.

FIG. 2 illustrates an embodiment of an apparatus 200 that includes a disk controller 130. In particular, disk controller 130 includes a read/write channel 140 for reading and writing data to and from disk 102 through read/write heads 104. Disk formatter 125 is included for controlling the formatting of data and provides clock signals and other timing signals that control the flow of the data written to, and data read from disk 102. Servo formatter 120 provides clock signals and other timing signals based on servo control data read from disk 102. Device controllers 105 control the operation of drive devices 109 such as actuator 108 and the servo motor, etc. Host interface 150 receives read and write commands from host device 50 and transmits data read from disk 102 along with other control information in accordance with a host interface protocol. In one embodiment, the host interface protocol can include, SCSI, SATA, enhanced integrated drive electronics (EIDE), or any number of other host interface protocols, either open or proprietary that can be used for this purpose.

Disk controller 130 further includes a processing module 132 and memory module 134. Processing module 132 can be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signal (analog and/or digital) based on operational instructions that are stored in memory module 134. When processing module 132 is implemented with two or more devices, each device can perform the same steps, processes or functions in order to provide fault tolerance or redundancy. Alternatively, the function, steps and processes performed by processing module 132 can be split between different devices to provide greater computational speed and/or efficiency.

Memory module 134 may be a single memory device or a plurality of memory devices. Such a memory device may be a read-only memory, random access memory, volatile memory, non-volatile memory, static random access memory (SRAM), dynamic random access memory (DRAM), flash memory, cache memory, and/or any device that stores digital information. Note that when the processing module 132 implements one or more of its functions via a state machine, analog circuitry, digital circuitry, and/or logic circuitry, the memory module 134 storing the corresponding operational instructions may be embedded within, or external to, the circuitry comprising the state machine, analog circuitry, digital circuitry, and/or logic circuitry. Further note that, the memory module 134 stores, and the processing module 132 executes, operational instructions that can correspond to one or more of the steps or a process, method and/or function illustrated herein.

Disk controller 130 includes a plurality of modules, in particular, device controllers 105, processing module 132, memory module 134, read/write channel 140, disk formatter 125, and servo formatter 120 that are interconnected via bus 136 and bus 137. The host interface 150 can be connected to only the bus 137 and communicates with the host device 50. Each of these modules can be implemented in hardware, firmware, software or a combination thereof, in accordance with the broad scope of the present invention. While a particular bus architecture is shown in FIG. 2 with buses 136 and 137, alternative bus architectures that include either a single bus configuration or additional data buses, further connectivity, such as direct connectivity between the various modules, are likewise possible to implement the features and functions included in various embodiments.

In one possible embodiment, one or more modules of disk controller 130 are implemented as part of a system on a chip (SoC) integrated circuit. In an embodiment, this SoC integrated circuit includes a digital portion that can include additional modules such as protocol converters, linear block code encoding and decoding modules, etc., and an analog portion that includes device controllers 105 and optionally additional modules, such as a power supply, etc. In a further embodiment, the various functions and features of disk controller 130 are implemented in a plurality of integrated circuit devices that communicate and combine to perform the functionality of disk controller 130.

When the drive unit 100 is manufactured, disk formatter 125 writes a plurality of servo wedges along with a corresponding plurality of servo address marks at equal radial distance along the disk 102. The servo address marks are used by the timing generator for triggering the "start time" for various events employed when accessing the media of the disk 102 through read/write heads 104.

Figure 3:
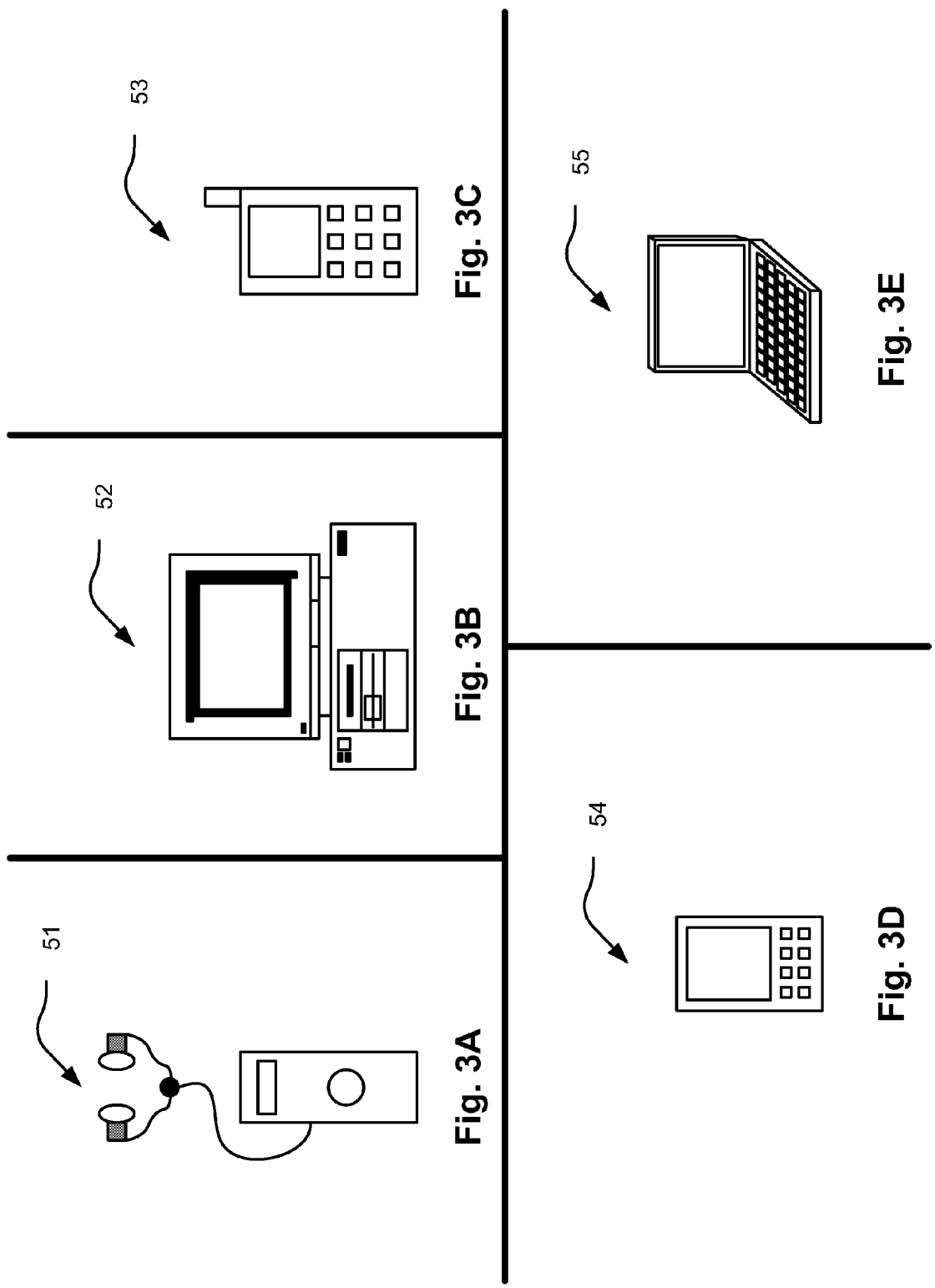
FIG. 3A illustrates an embodiment of a handheld audio unit.
FIG. 3B illustrates an embodiment of a computer.
FIG. 3C illustrates an embodiment of a wireless communication device.
FIG. 3D illustrates an embodiment of a personal digital assistant (PDA).
FIG. 3E illustrates an embodiment of a laptop computer.

FIG. 3A illustrates an embodiment of a handheld audio unit 51. In particular, disk drive unit 100 can be implemented in the handheld audio unit 51. In one possible embodiment, the disk drive unit 100 can include a small form factor magnetic hard disk whose disk 102 has a diameter 1.8" or smaller that is incorporated into or otherwise used by handheld audio unit 51 to provide general storage or storage of audio content such as motion picture expert group (MPEG) audio layer 3 (MP3)

files or Windows Media Architecture (WMA) files, video content such as MPEG4 files for playback to a user, and/or any other type of information that may be stored in a digital format.

FIG. 3B illustrates an embodiment of a computer 52. In particular, disk drive unit 100 can be implemented in the computer 52. In one possible embodiment, disk drive unit 100 can include a small form factor magnetic hard disk whose disk 102 has a diameter 1.8" or smaller, a 2.5" or 3.5" drive or larger drive for applications such as enterprise storage applications. Disk drive 100 is incorporated into or otherwise used by computer 52 to provide general purpose storage for any type of information in digital format. Computer 52 can be a desktop computer, or an enterprise storage devices such a server, of a host computer that is attached to a storage array such as a redundant array of independent disks (RAID) array, storage router, edge router, storage switch and/or storage director.

FIG. 3C illustrates an embodiment of a wireless communication device 53. In particular, disk drive unit 100 can be implemented in the wireless communication device 53. In one possible embodiment, disk drive unit 100 can include a small form factor magnetic hard disk whose disk 102 has a diameter 1.8" or smaller that is incorporated into or otherwise used by wireless communication device 53 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 53, emails, webpage information and other information downloaded from the Internet, address book information, and/or any other type of information that may be stored in a digital format.

In a possible embodiment, wireless communication device 53 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 53 is capable of communicating via the Internet to access email, download content, access websites, and provide steaming audio and/or video programming. In this fashion, wireless communication device 53 can place and receive telephone calls, text messages such as emails, short message service (SMS) messages, pages and other data messages that can include attachments such as documents, audio files, video files, images and other graphics.

FIG. 3D illustrates an embodiment of a personal digital assistant (PDA) 54. In particular, disk drive unit 100 can be implemented in the personal digital assistant (PDA) 54. In one possible embodiment, disk drive unit 100 can include a small form factor magnetic hard disk whose disk 102 has a diameter 1.8" or smaller that is incorporated into or otherwise used by personal digital assistant 54 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 3E illustrates an embodiment of a laptop computer 55. In particular, disk drive unit 100 can be implemented in the laptop computer 55. In one possible embodiment, disk drive unit 100 can include a small form factor magnetic hard disk whose disk 102 has a diameter 1.8" or smaller, or a 2.5" drive. Disk drive 100 is incorporated into or otherwise used by laptop computer 52 to provide general purpose storage for any type of information in digital format.

Figure 4:
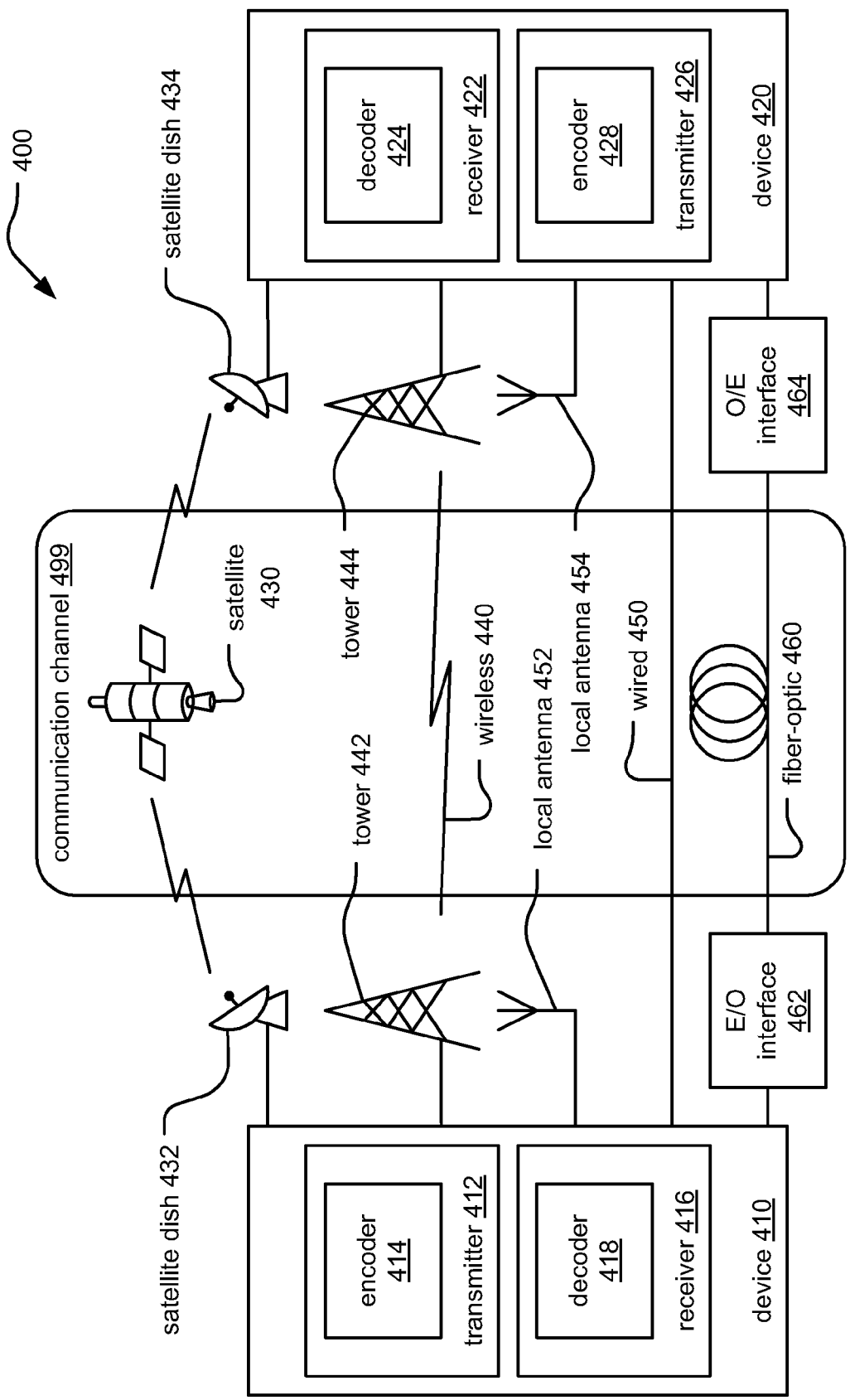
FIG. 4 illustrates an embodiment of a communication system.

FIG. 4 is a diagram illustrating an embodiment of a communication system 400.

Referring to FIG. 4, this embodiment of a communication system 400 is a communication channel 499 that communicatively couples a communication device 410 (including a transmitter 412 having an encoder 414 and including a receiver 416 having a decoder 418) situated at one end of the communication channel 499 to another communication device 420 (including a transmitter 426 having an encoder 428 and including a receiver 422 having a decoder 424) at the other end of the communication channel 499. In some embodiments, either of the communication devices 410 and 420 may only include a transmitter or a receiver. There are several different types of media by which the communication channel 499 may be implemented (e.g., a satellite communication channel 430 using satellite dishes 432 and 434, a wireless communication channel 440 using towers 442 and 444 and/or local antennae 452 and 454, a wired communication channel 450, and/or a fiber-optic communication channel 460 using electrical to optical (E/O) interface 462 and optical to electrical (O/E) interface 464)). In addition, more than one type of media may be implemented and interfaced together thereby forming the communication channel 499.

The signals employed within this embodiment of a communication system 400 can be Reed-Solomon (RS) coded signals, LDPC (Low Density Parity Check) coded signal, turbo coded signals, turbo trellis coded modulation (TTCM), or coded signal generated using some other error correction code (ECC). Any of a very wide variety of applications that employ ECC coding can benefit from various aspects of the invention, including any of those types of communication systems depicted in FIG. 4. Moreover, other types of devices and applications that employ ECC coding (e.g., including those employing some type of HDD or other memory storage means) can also benefit from various aspects of the invention.

Means and methods of improving the performance of any sequence detector, such as a Viterbi Algorithm, a SOVA or BCJR detector by constraining the sequence detector when the sequence detector has read a known pattern is discussed herein. In some embodiments, these methods are applied to overcome, control or limit the effects of noise and/or interfering signals (i.e. ISI) on a read back signal that noise and/or interfering signals has degraded.

Overcoming noise and interfering signals (i.e. overcoming/limiting/controlling ISI) allows higher storage within physical media such as that of a hard disk drive (HDD). In other embodiments, addressing these issues may allow for an increase in the amount of data transmitted within communication channels therein. These methods involve reading an analog waveform from a physical media or communication channel. Then a sample sequence may be derived from that waveform. This sample sequence represents a bit sequence having predetermined known bit sub-patterns embedded in it. For example, the bit sequence may include a preamble, sync mark, data, and post-amble. Because a sequence detector compares the received pattern to the patterns generated by every possible bit sequence, knowledge of the ideal or actual bit sequences and their components allows us to reduce the set of possible bit sequences considered. Leveraging knowledge of known patterns allows a sequence detector to "enforce" the existence of these known patterns when decoding the sample sequence to produce a bit sequence.

The phase of this analog waveform is determined and the analog waveform is sampled at regular intervals using a timing recovery scheme. A continuous analog signal is read from the disk. By examining peaks and valleys in this continuous analog signal, one can determine where to "sample" the signal to produce a discrete sample sequence that represents the analog signal. The sample sequence is sent to the sequence detector (i.e. Viterbi algorithm) where the sequence detector determines the bit sequence most likely represented by the sample sequence. The set of possible bit sequences may be pruned based on knowledge of the ideal bit sequence. Then the sample sequence may be compared to a reduced set of possible bit sequences to select the decoded bit sequence.

Figure 5:
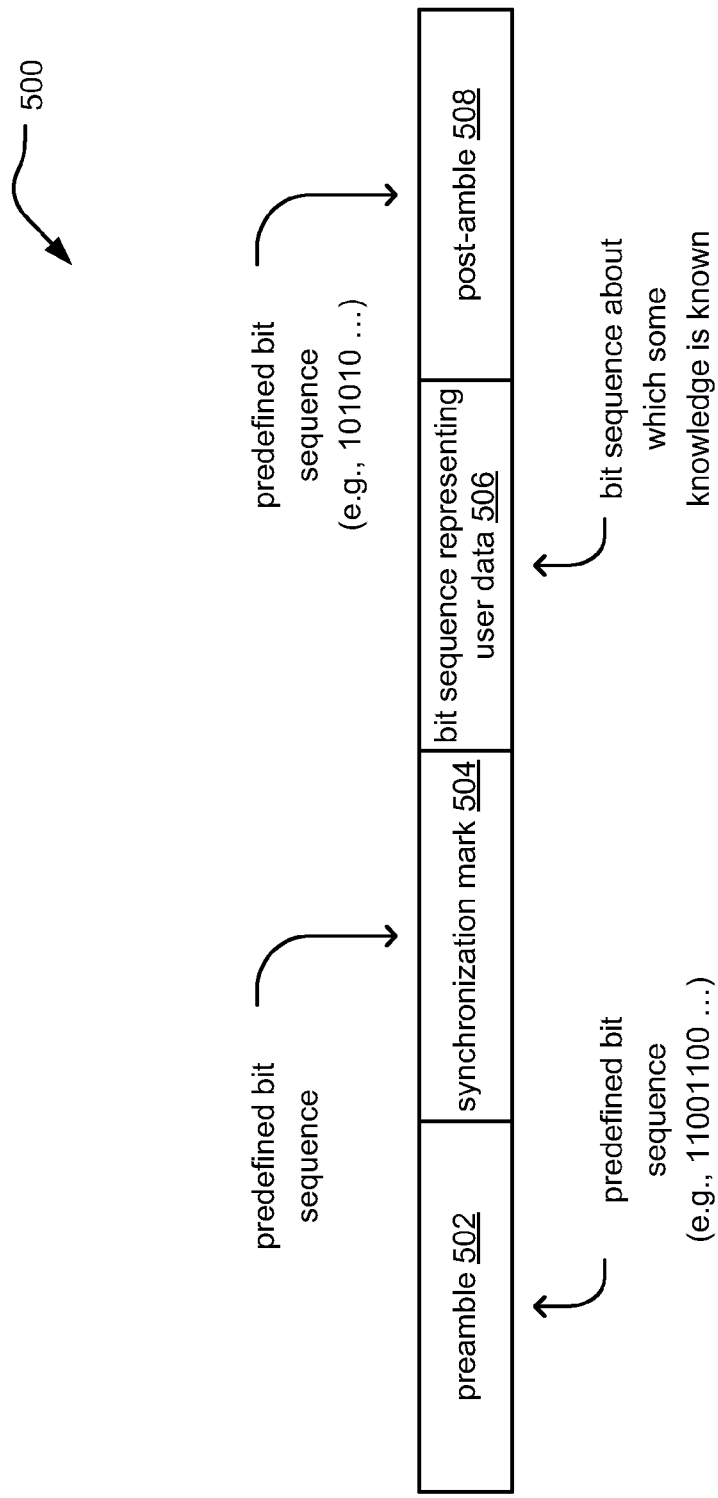
FIG. 5 illustrates an embodiment of a how data or bit patterns are written such as to a disk of a hard disk drive (HDD).

FIG. 5 illustrates an embodiment 500 of a how data or bit patterns are written such as to a disk of a hard disk drive (HDD). As shown in FIG. 5, bit sequences 500 written to a data sector within a HDD and include a preamble 502, sync mark 504, data 506 (that may be composed of multiple code words) and/or post-amble 508. Specific knowledge about the format of each of these sequences may be used to properly decode the bit sequence. For example, the preamble may be a predefined series of bits, such as 11001100 . . . This series as read may appear to be a sine wave. Finding this known portion of the signal allows the disk controller to determine the phase of the analog waveform and determine the alignment of other components within the sample sequence. Thus the hard disk drive controller may determine what portion of the bit sequence within the data sector is currently being examined. Sync mark 504 follows preamble 502. Sync mark 504 must be a known, predetermined bit pattern that identifies where data 506 begins. Furthermore, in addition to uniquely identifying the start of data 506, the sync mark is designed not to be confused with the preamble. Post-amble 508 follows data 506. Again, post-amble 508 may be a known bit sequence. For example, the bit sequence 101010 . . . may be chosen as the post-amble. Thus, the data path will have prior knowledge of preamble 502, sync mark 504 and post-amble 508 which ideally are predetermined bit patterns.

The operations of the data path in a HDD (e.g., such as FIG. 2 that includes the disk controller 130 and its read/write channel 140 that couples to the read/write heads 104 of the HDD) are employed as a context in which to describe certain aspects of the invention. To identify the bit sequence, the read/write channel 140 reads the analog waveform from the physical media (e.g., via the read/write heads 104). The phase of this analog waveform is determined, and it is sampled at regular intervals using a timing recovery scheme. This sample sequence is sent to a sequence detector which compares the received sequence to all possible transmitted sequences, generating a path through a trellis that represents the estimated sequence. That trellis path may pass through known states at certain times. For example, the known bit sequence may include the preamble, sync mark, data, and post-amble as discussed with reference to FIG. 5. Knowledge of the ideal bit sequences at certain time instances makes it possible to remove some of the paths (i.e. possible bit sequences) under consideration, hence improving performance of the sequence detector. Dis-allowed bit sequences may be pruned from the set of possible bit sequences. Then the sample sequence may be compared to a set of possible bit sequences to select a decoded bit sequence.

The post-amble may be selected as a high frequency, low DC content signal. This is particularly useful in formats where data is written to the disk or physical media using perpendicular recording. This high frequency, low DC content signal helps to prevent baseline wander which may be observed within a disk drive utilizing perpendicular recording. Knowledge of the bit sequence within the data sector allows one to prune dis-allowed states. The pruning of the dis-allowed bit sequences then reduces the number of bit sequences within the set of possible bit sequences to be compared to the estimated sample sequence in order to properly select the decoded bit sequence.

Pruning the dis-allowed bit sequence may be done based on knowledge of every portion of the above-described data sector as well as knowledge of how the trellis's converge in the past. First the set of possible bit sequences may be pruned based on the preamble. For example, bit sequences (states or trellises) not following the predetermined bit sequence can be pruned (removed, reprioritized, or labeled as dis-allowed) from the set of possible bit sequences. Next the set of possible bit sequences may be further pruned based on knowledge of the sync mark. The sync mark may have an exact predetermined sequence. The bit sequences (trellis paths) within the set of possible bit sequences that do not conform to the constraints of the sync mark may then be removed. Next, code words within the data portion of the bit sequence allow the set of possible bit sequences to be further pruned. For example, the parity of the code words may be known. This would allow those bit sequences not having code words with the proper parity to be pruned. The post-amble, which comprises a predetermined bit sequence, allows further pruning of the allowed bit sequences.

Any sequence detector, such as, but not limited to a Viterbi Algorithm, a SOVA or BCJR detector, may then be employed to determine the bit sequence. Embodiments of the present invention may prune the set of possible bit sequences with knowledge of known pattern(s) within the ideal bit sequence or how the Trellis's converge to improve system performance. The number of lengths to be considered in how the Trellis's converge may be adjusted to reduce latency. However, reducing latency in this manner may reduce system performance. This knowledge eliminates the need for the sequence detector to examine every possible bit sequence. This reduces the memory, power requirements and latency by making these decisions. Thus, the decoding process is streamlined even where a small number of possible bit sequences are removed.

Figure 6:
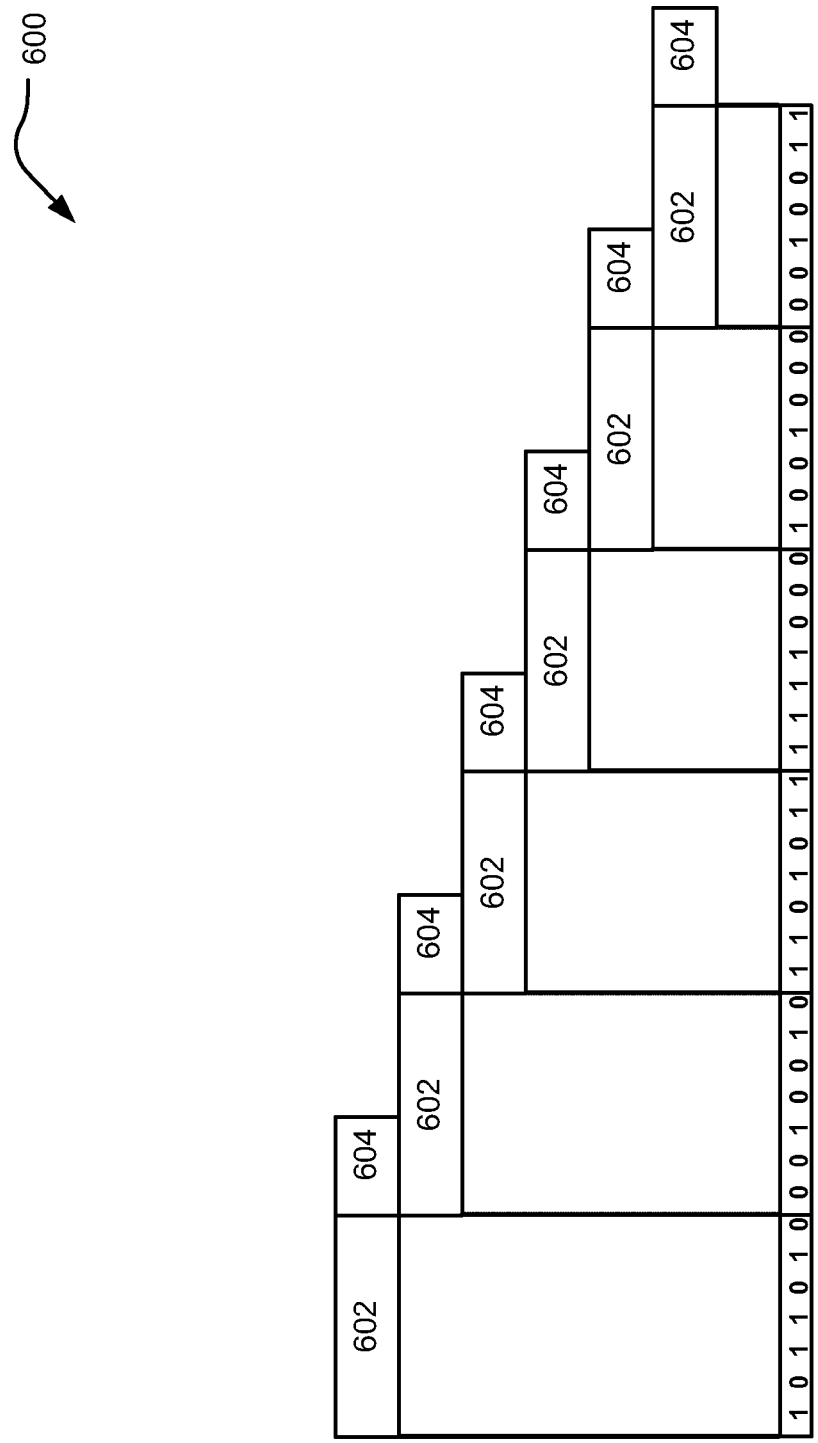
FIG. 6 illustrates an embodiment of how sliding blocks or chunks of data may contain constraints such as a periodic parity bit.

FIG. 6 illustrates an embodiment 600 of how sliding blocks or chunks of data may contain constraints such as a periodic parity bit. A constraint on the bit sequences exists wherein the data may be in sliding blocks or chunks. For example, every block 602 may end in a parity bit (e.g., where the decoded block 602 may overlap with sliding block 604). Thus, there is known information about the parity bit at the end of block 602 as well as knowing how trellises converge in the past.

Figure 7:
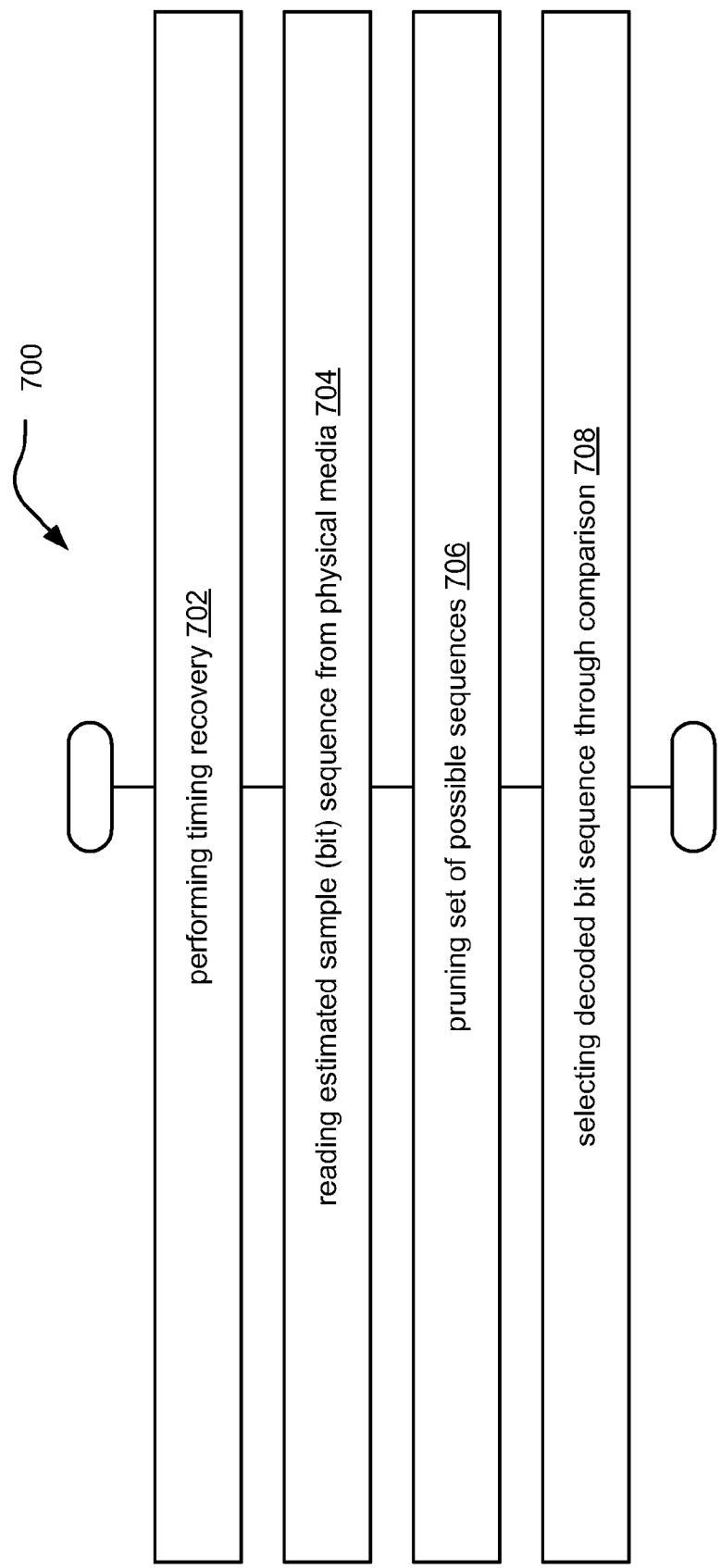
FIG. 7 illustrates an embodiment of a method to control, limit, or overcome ISI.

FIG. 7 illustrates an embodiment of a method 700 to control, limit, or overcome ISI. Operations 700 begin with Step 702 where a timing recovery scheme is performed. Timing recovery determines phase and timing interval at which the analog waveform is sampled. In step 704 a sample sequence is determined by the channel based on the analog waveform read from the physical media (i.e. disk in an HDD) or communication channel. The bit sequence that the sample sequence represents may have a pre-defined format similar to that discussed with reference to FIG. 5. This sample sequence is equalized (filtered) and sent to a sequence detector. In general, a sequence detector compares the received sample sequence to every possible sequence. However, embodiments of the present invention streamline this process by pruning (i.e. removing) dis-allowed bit sequences from the set of possible sequences in step 706 based on knowledge of the ideal sequence or how the Trellis converge at the survivor length.

The set of possible bit sequences may be pruned based on knowledge of the ideal or actual bit sequence at certain time instants, or how the Trellis converge in the past. Thus, with specific knowledge of the preamble, sync mark, data, post-amble and parity one can prune the available (i.e. reduce the number of) possible bit sequences.

In Step 708 the sample sequence may be compared to the reduced set of possible bit sequences in order to select a bit sequence as the decoded bit sequence.

Figure 8:
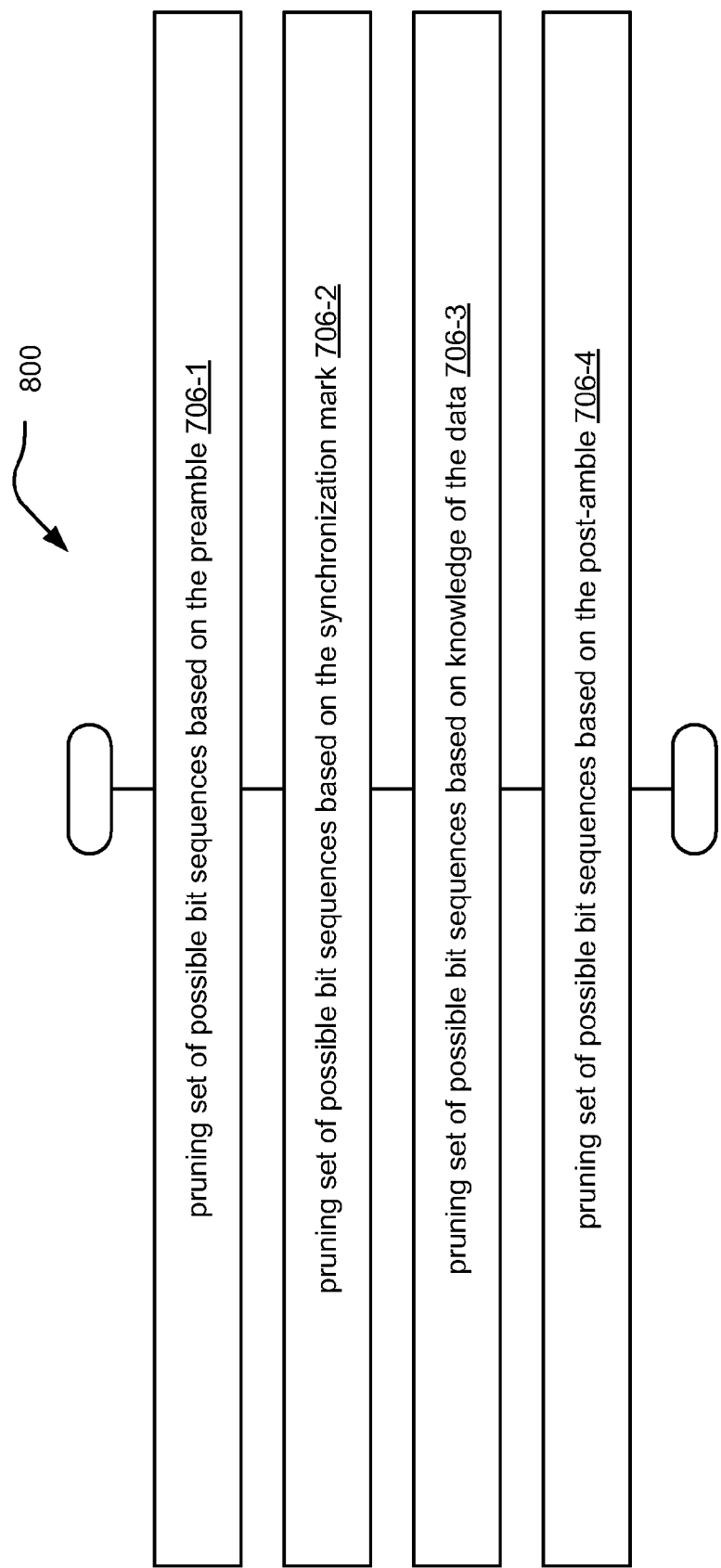
FIG. 8 illustrates an embodiment of a method of how pruning of a set of possible bit sequences may be divided into multiple steps.

FIG. 8 illustrates an embodiment of a method 800 of how pruning of a set of possible bit sequences may be divided into multiple steps. As shown in FIG. 8, pruning of the set of possible bit sequences may be based on any known pattern or other constraints within the ideal bit sequence to improve system performance. For example, for a bit sequence having a format as described with reference to FIG. 5, the pruning of the set of possible bit sequences may be based on knowledge of four portions of the ideal bit sequence. As shown here, Step 706 of FIG. 7 is divided into four components. In step 706-1 the set of possible bit sequences may be pruned based on knowledge of the preamble. The preamble may be made of a pre-determined bit sequence such as the bit pattern 11001100 . . . In Step 706-2 the set of possible bit sequences may then be further pruned based on specific knowledge of the sync mark. The sync mark may have a pre-determined bit sequence located at the end of the preamble. In Step 706-3 the set of possible bit sequences may be pruned based on parity within the bit sequence. For example, allowable bit sequences may have a periodic parity bit for every predetermined number of bits. Therefore, there may be multiple constraints within the data to further prune or reduce the set of possible bit sequences. Then, in Step 706-4 the set of possible bit sequences may be pruned based on the pre-determined bit sequence of the post-amble. By pruning the choices, i.e. reducing the number of possible bit sequences, a sequence detector such as but not limited to the decoding technique provided by the Viterbi algorithm may show significantly improved decisions in the region of the pruning.

Returning to FIG. 7 pruning is the removal of dis-allowed bit sequences. For example, some algorithms may compare the distance between the sample sequence and possible bit sequence(s) and then select the possible bit sequence having the least distance from the sample sequence. Where the distance between the sample sequence and possible bit sequence(s) is large, these possible bit sequence(s) may be automatically reprioritized as a dis-allowed bit sequence (i.e. essentially being removed from the set of possible bit sequences). Dis-allowed bit sequences may be removed from the set of possible bit sequence(s) by setting the distance between the estimated and dis-allowed bit sequence to a large value. This eliminates the need for the sequence detector to actually determine a distance between the sample sequence and possible bit sequence(s), although in practice the hardware computes the distances as it normally would. The computed distance is overridden by the large pruning value. The decoded bit sequence is selected from only those possible bit sequences that conform to constraints such as those identified above or other physical constraints associated with the data.

In summary, embodiments of the present invention provide a method that leverages knowledge of the actual or ideal bit sequence to improve the performance of any sequence detector, such as but not limited to a Viterbi Algorithm, a "Soft-Output Viterbi Algorithm (SOVA)" or Bahl, Cocke, Jelinek, and Raviv (BCJR) detector. This improved performance results by constraining the sequence detector when the sequence detector has knowledge of known patterns within the sample sequence. One set of embodiments control or limit the effects of ISI on a read-back signal in order to allow higher storage within physical media such as that of a HDD. This method involves reading an analog waveform from the physical media. The phase of this analog waveform is determined and it is sampled at regular intervals using a timing recovery scheme. This sample sequence is equalized (filtered) and sent to a sequence detector which will compare the received sequence to all possible transmitted sequences, generating a path through a trellis that represents the estimated sequence. That trellis path may pass through known states at certain times. For example, the known bit sequence may include a preamble, synchronization (sync) mark, data, and post-amble. Knowledge of the ideal bit sequences at certain time instances makes it possible to remove some of the paths under consideration, hence improving performance of the sequence detector. Any dis-allowed bit sequences may be pruned from the set of possible bit sequences based on knowledge of the ideal bit sequence. Then the sample sequence may be compared to a set of possible bit sequences to select a decoded bit sequence.

While certain aspects of the present invention have been described in terms of a magnetic disk, other nonmagnetic storage devices including optical disk drives including compact disks (CD) drives such as CD-R and CD-RW, digital video disk (DVD) drives such as DVD-R, DVD+R, DVD-RW, DVD+RW, etc can likewise be implemented in accordance with the functions and features of the presented invention described herein.

Figure 9:
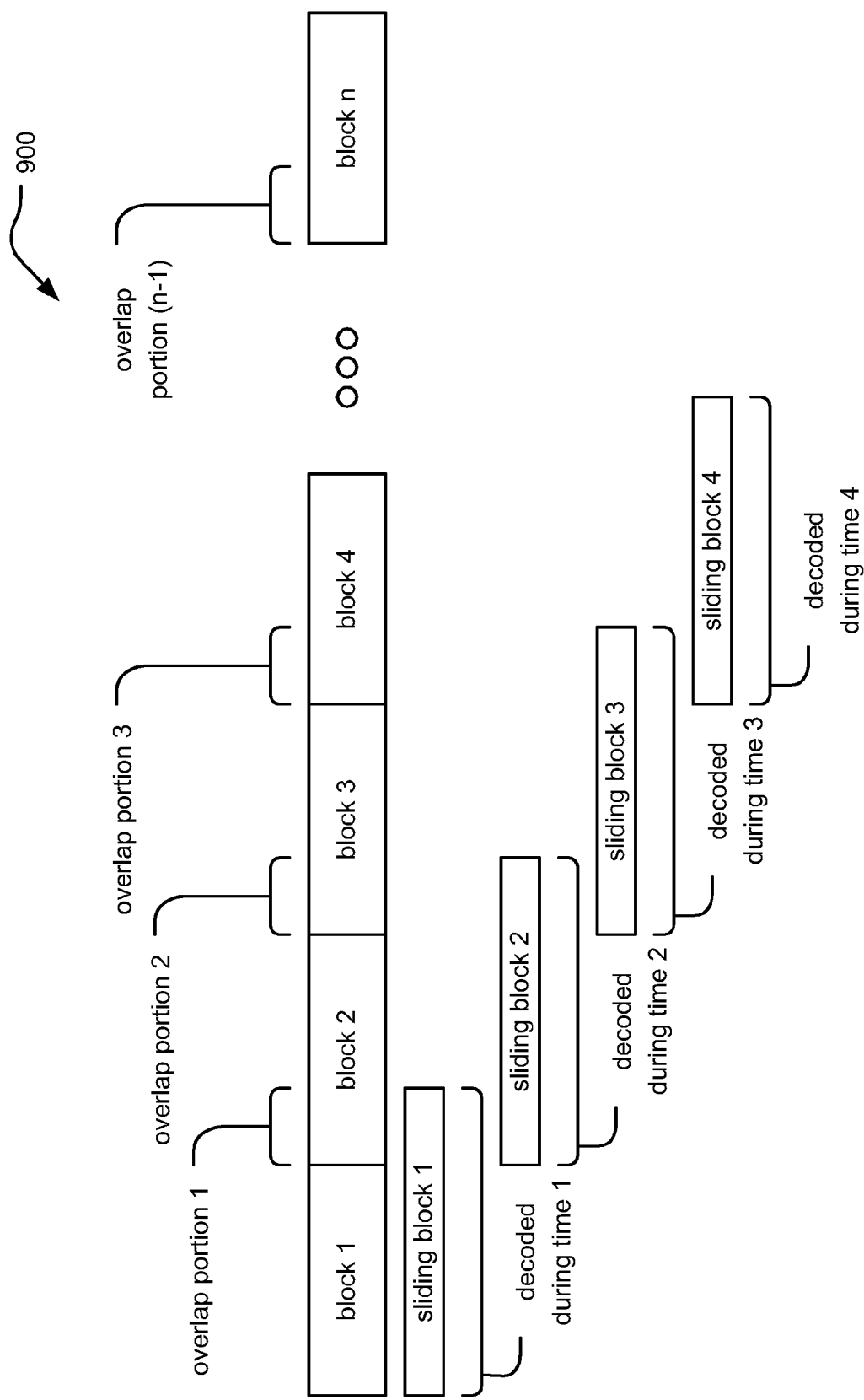
FIG. 9 illustrates an embodiment of decoding of multiple blocks using sliding block traceback.

FIG. 9 illustrates an embodiment 900 of decoding of multiple blocks using sliding block traceback. A block coded signal including multiple blocks (e.g., shown as block 1, block 2, block 3, block 4, . . . , and up to block n) is decoded on a block by block basis such that only a single block and a corresponding overlap portion are processed at a given time. In accordance with the novel traceback approach presented herein, only the surviving paths between each trellis stage are constructed to generate the surviving path through the block of interest.

During a first period of time or a time 1, a sliding block 1 is processed (e.g., which includes block 1 and an overlap portion 1) to generate and output estimates of the bits in the block 1. During a second period of time or a time 2, a sliding block 2 is processed (e.g., which includes block 2 and an overlap portion 2) to generate and output estimates of the bits in the block 2. This decoding continues through all of the blocks of the coded block signal.

As described in other embodiments herein, a decoding module can be implemented to perform the block by block decoding and a memory can be implemented (and coupled thereto) to assist in the storage of the blocks of the block coded signal and their corresponding overlap portions. As can be seen in this diagram, an overlap portion of one block can be a portion of an adjacent block.

Figure 10:
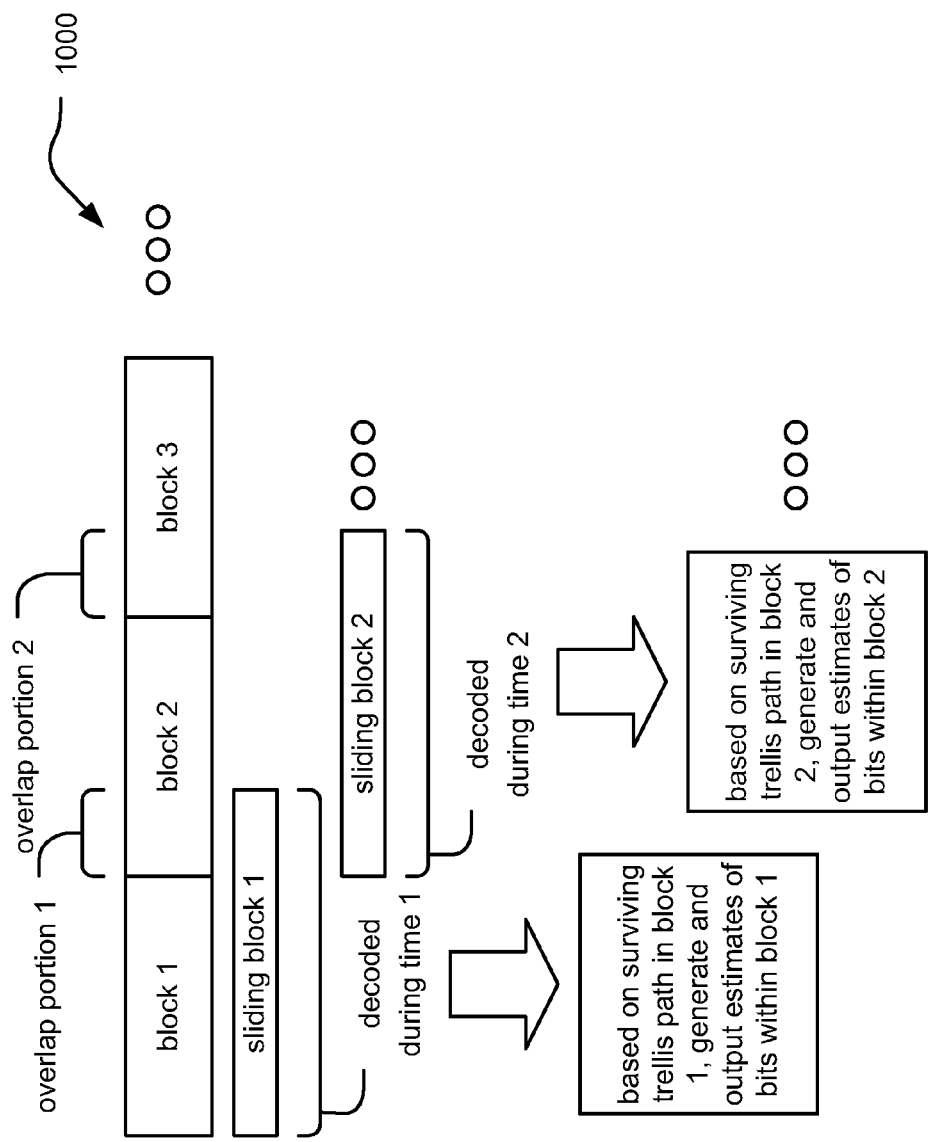
FIG. 10 illustrates an alternative embodiment of decoding of multiple blocks using sliding block traceback.

FIG. 10 illustrates an alternative embodiment 1000 of decoding of multiple blocks using sliding block traceback. This embodiment shows the block by block decoding basis such that only one block of the coded block signal is decoded at a given time. That is to say, only the surviving path through any one block is constructed and output at a time.

For example, the block 1 is decoded during a first period of time or a time 1, and the corresponding estimates of that block are output. Then, the bit estimates and trellis state or states near the end of block 1 (e.g., near the block boundary between block 1 and block 2) can be leveraged when decoding block 2.

For example, an estimate of a last bit within the block 1 can be employed when identifying a surviving trellis path through the block 2. Moreover, a state of a final trellis stage within the block 1 (e.g., corresponding to the surviving trellis path through the block 1) can be employed when identifying an initial state of the surviving trellis path through the block 2.

In contradistinction to prior art approaches which keep track of multiple competing paths through various blocks of a block coded signal, the novel means presented herein constructs only the surviving paths through a given block at a time. Once a block (including its corresponding overlap portion) is processed, then the estimates of that block can be output. This provides for a significant reduction in the memory management necessary within prior art decoding approaches that construct a much larger number of surviving paths (e.g., typically using a register exchange approach) before making any final estimate of bits encoded within the signal. The prior art approaches that employ such a register exchange approach are not traceback decoding approaches at all. In such prior art register exchange approaches, all surviving sequences are constructed compared to constructing only the one winning and surviving path through the block of interest (e.g., on a block by block basis) in accordance with the novel decoding approach presented herein.

Figure 11:
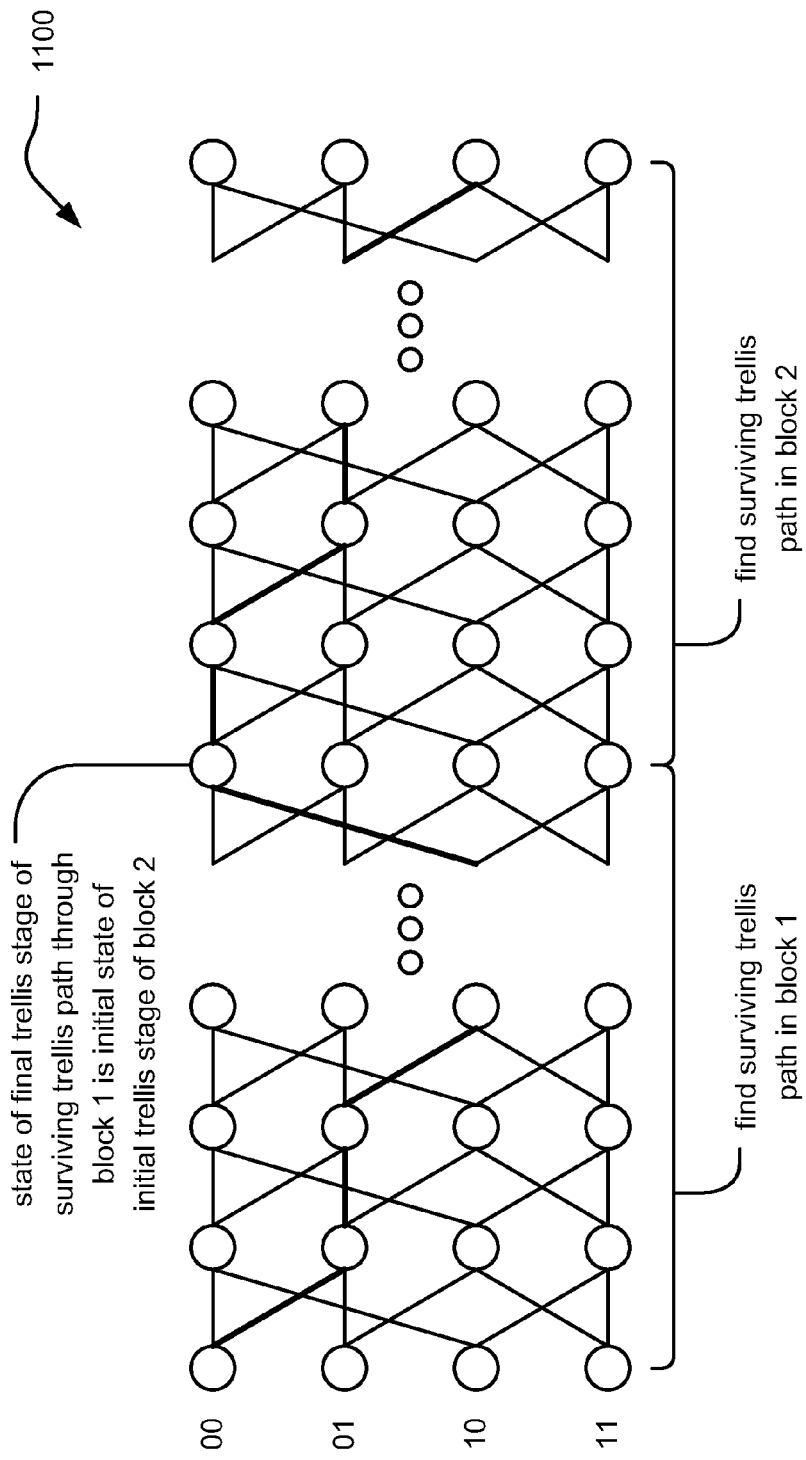
FIG. 11 illustrates an embodiment of multiple stages of a trellis showing a surviving path through each corresponding block.

FIG. 11 illustrates an embodiment 1100 of multiple stages of a trellis showing a surviving path through each corresponding block. A 4 state trellis, having the state connectivity as shown in the diagram, is employed here for illustration. However, it is noted that any other sized trellis, having any desired or appropriate state connectivity, may be employed in accordance with the novel traceback decoding approach presented herein without departing from the scope and spirit of the invention.

When processing each block, a surviving trellis path is constructed through each trellis stage. The state of the final trellis stage of the surviving trellis path in block 1 is employed as the initial trellis stage when decoding to find the surviving trellis path in block 2. Moreover, an estimate of a final bit within block 1 (e.g., adjacent to block 2) may be employed when decoding to find the surviving trellis path in block 2.

Again, when comparing the novel decoding means presented herein to prior art decoding approaches, it can be seen that the use of a sliding block effectuates the advancement through the coded block signal by a much smaller portion that employed in accordance with prior art decoding approaches. The novel traceback approach presented herein employs only the block of interest and its corresponding overlap portion to make estimates of information encoded within that block; also, when a previous/adjacent block within the coded block signal has already been decoded, then the block of interest being decoding can know the initial state of itself (by using the last state of the previous/adjacent block). The novel traceback decoding employed herein employs and decodes one block length per time.

Figure 12:
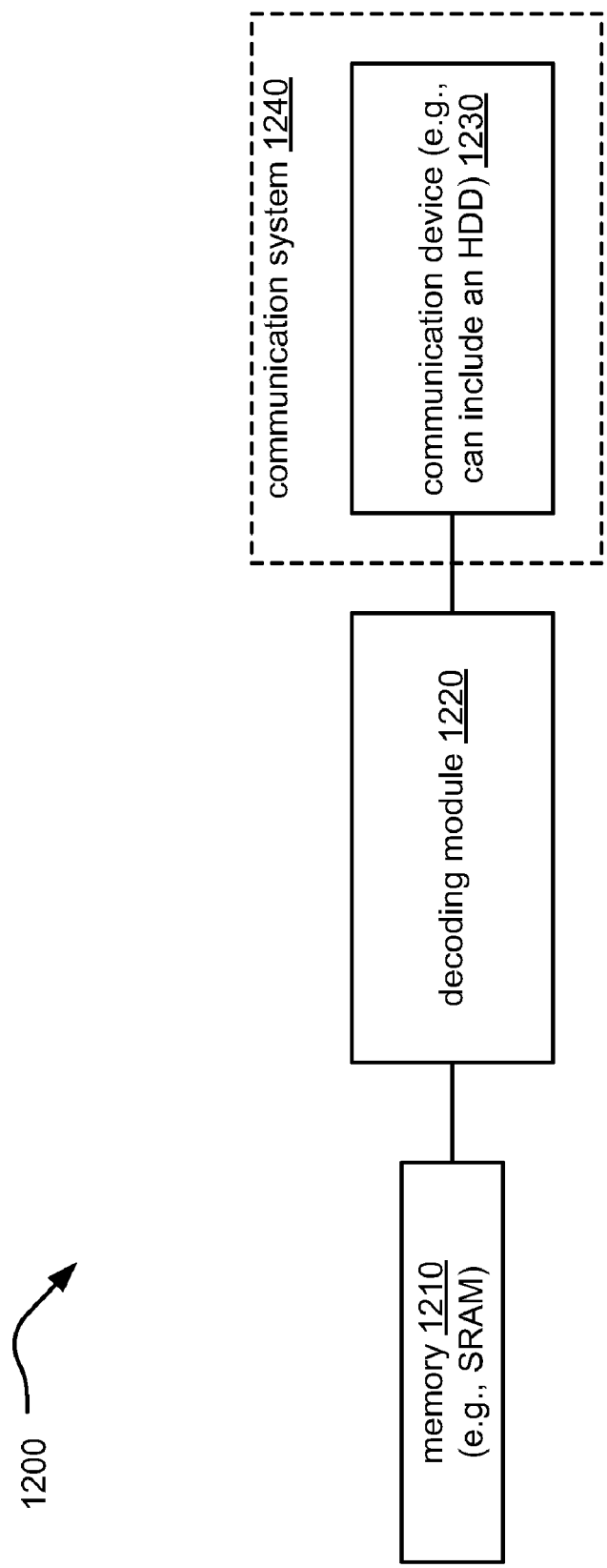
FIG. 12 illustrates an embodiment of an apparatus that is operable to perform decoding of multiple blocks using sliding block traceback.

FIG. 12 illustrates an embodiment of an apparatus 1200 that is operable to perform decoding of multiple blocks using sliding block traceback.

The apparatus 1200 includes a decoding module 1220, and a memory 1210. The memory 1210 is coupled to the decoding module 1220, and the memory 1210 may be implemented to store operational instructions that enable the decoding module 1220 to perform a variety of functions. In addition, the memory 1210 can be implemented to assist in the storage of the blocks of a block coded signal and their corresponding overlap portions so that the decoding module 1220 can perform the sliding block traceback decoding in accordance with the principles described herein.

The decoding module 1220 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1210 may be implemented using SRAM, and the memory 1210 may be a single memory device or a plurality of memory devices. Such a memory device may be a read-only memory, random access memory, volatile memory, non-volatile memory, static memory, dynamic memory, flash memory, and/or any device that stores digital information. Note that when the decoding module 1220 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the sliding block traceback decoding is to be performed can be provided from the apparatus 1200 to a communication system 1240, that includes a communication device 1230, that is operable to perform sliding block traceback decoding. For example, such information regarding the manner of sliding block traceback decoding to be performed can also be provided from the decoding module 1220 to any of a variety of communication devices 1230 implemented within the communication system 1240 as well. Each communication device 1230 can also include a corresponding decoding module and memory implemented to effectuate sliding block traceback decoding therein.

It is noted that the apparatus 1200 and/or the communication device 1230 may include a hard disk drive (HDD), and the block coded signal being decoding therein may be read from such a HDD.

Figure 13:
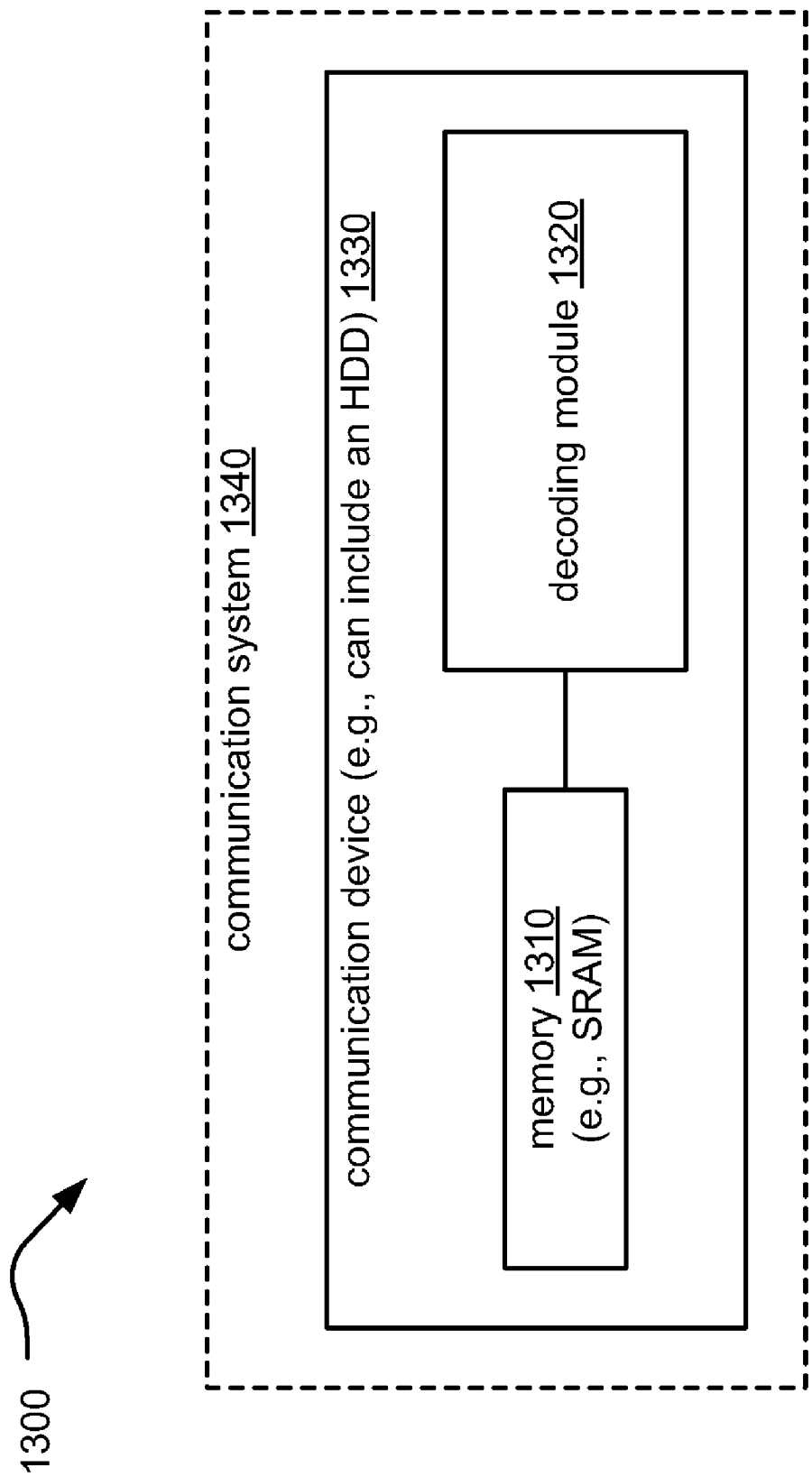
FIG. 13 illustrates an alternative embodiment of an apparatus that is operable to perform decoding of multiple blocks using sliding block traceback.

FIG. 13 illustrates an alternative embodiment of an apparatus 1300 that is operable to perform decoding of multiple blocks using sliding block traceback.

The apparatus 1300 includes a decoding module 1320, and a memory 1310. The memory 1310 is coupled to the decoding module 1320, and the memory 1310 may be implemented to store operational instructions that enable the decoding module 1320 to perform a variety of functions. In addition, the memory 1310 can be implemented to assist in the storage of the blocks of a block coded signal and their corresponding overlap portions so that the decoding module 1320 can perform the sliding block traceback decoding in accordance with the principles described herein.

The decoding module 1320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1310 may be implemented using SRAM, and the memory 1310 may be a single memory device or a plurality of memory devices. Such a memory device may be a read-only memory, random access memory, volatile memory, non-volatile memory, static memory, dynamic memory, flash memory, and/or any device that stores digital information. Note that when the decoding module 1320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 1300 can be any of a variety of communication devices 1330, or any part or portion of any such communication device 1330. Any such communication device 1330 that includes the decoding module 1320 and/or memory 1310 can be implemented within any of a variety of communication systems 1340 as well. It is also noted that various embodiments of decoding of a coded block signal using sliding block traceback as presented herein, and equivalents thereof, may be applied to many types of communication systems and/or communication devices.

It is noted that the apparatus 1300 and/or the communication device 1330 may include a HDD, and the block coded signal being decoding therein may be read from such a HDD.

Figure 14:
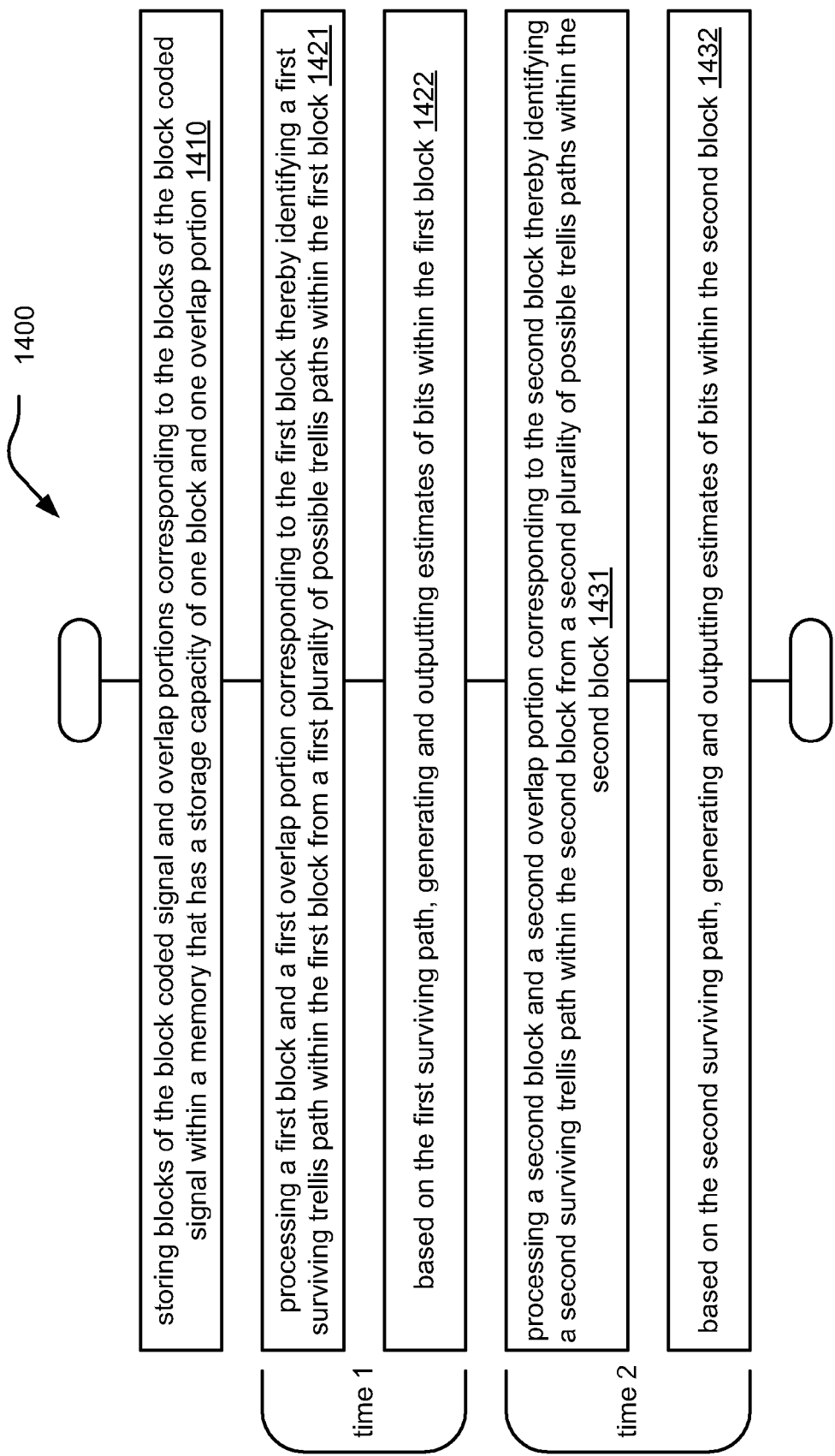
FIG. 14 illustrates an embodiment of a method for performing sliding traceback decoding of a block coded signal.

FIG. 14 illustrates an embodiment of a method 1400 for performing sliding traceback decoding of a block coded signal.

The method 1400 begins, as shown in a block 1410, by storing blocks of the block coded signal and overlap portions corresponding to the blocks of the block coded signal within a memory that has a storage capacity of one block and one overlap portion.

The next two steps are performed during a first time period or during time 1. The method 1400 continues by processing a first block and a first overlap portion corresponding to the first block thereby identifying a first surviving trellis path within the first block from a first plurality of possible trellis paths within the first block, as shown in a block 1421. The method 1400 continues by generating and outputting estimates of bits within the first block based on the first surviving path, as shown in a block 1422.

The next two steps are performed during a second time period or during time 2. The method 1400 continues by processing a second block and a second overlap portion corresponding to the second block thereby identifying a second surviving trellis path within the second block from a second plurality of possible trellis paths within the second block, as shown in a block 1431. The method 1400 continues by generating and outputting estimates of bits within the second block based on the second surviving path, as shown in a block 1432.

In certain embodiments, the method 1400 can also involve employing a state of a final trellis stage of the first surviving trellis path within the first block as a state of an initial trellis stage of the second surviving trellis path within the second block.

Figure 15:
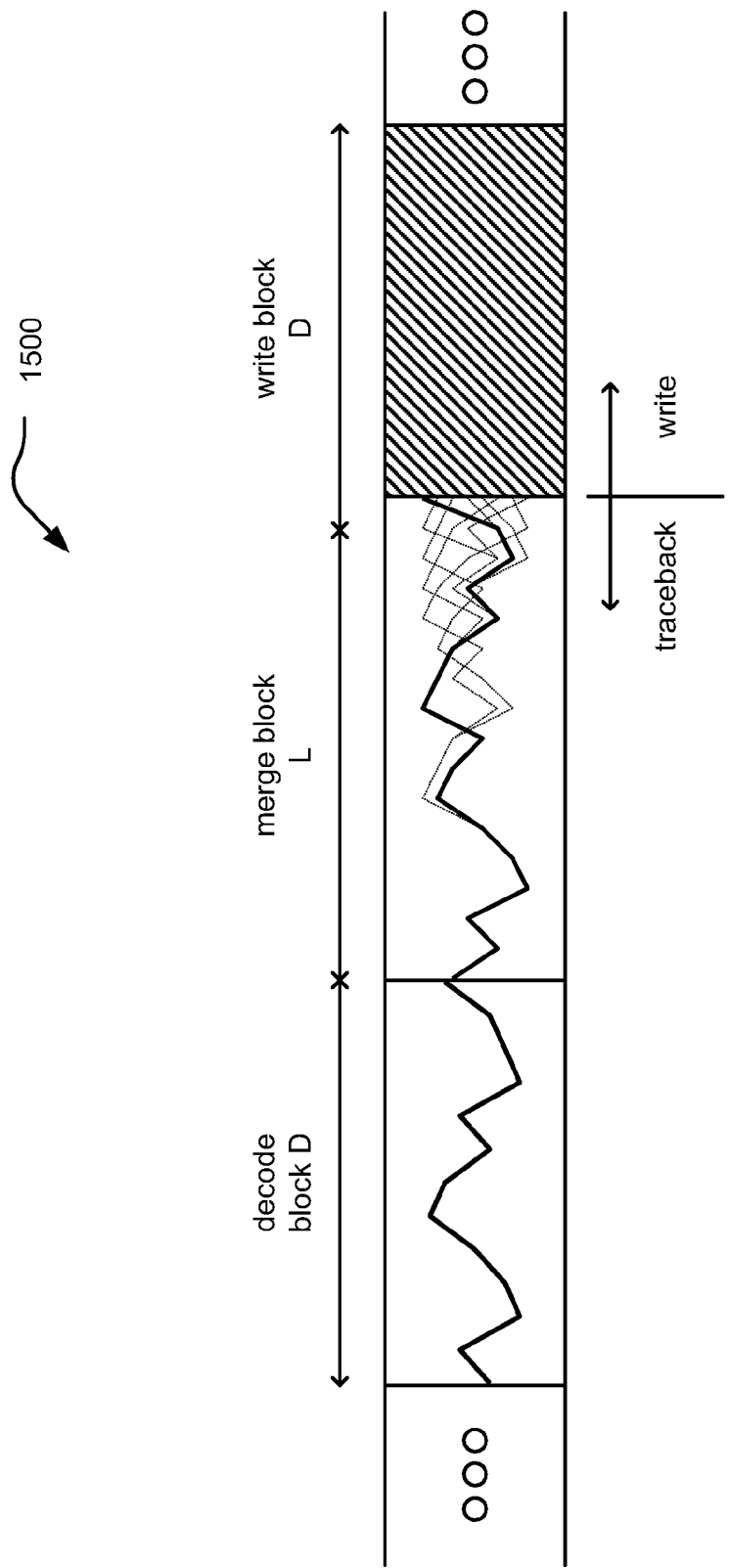
FIG. 15 illustrates an embodiment of adjacent blocks undergoing processing in accordance with sliding traceback decoding of a block coded signal.

FIG. 15 illustrates an embodiment 1500 of adjacent blocks undergoing processing in accordance with sliding traceback decoding of a block coded signal. The writing and reading depicted in this diagram may be viewed as being in accordance with the writing and reading of information to/from storage media of a HDD.

As shown in such an embodiment, a write block of size D is written while a decode block of size D is being decoded. During a block of D cycles, a decoding module performing sliding block traceback decoding of a coded block signal performs at least the following 2 operations:

1. D writes to store D decision vectors computed by an Add Compare Select (ACS) module therein; and
 2. L+D reads to decode the D symbols in the decode block of size D.

In this embodiment, the merge block of size L is shown as including an overlap portion corresponding to the decode block of size D. As can be seen, only a surviving trellis path through the decode block D is constructed in accordance with the novel means of performing sliding block traceback decoding presented herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A decoder implemented to perform sliding traceback decoding of a block coded signal, the decoder comprising:
 a memory implemented to store blocks of the block coded signal and overlap portions corresponding to the blocks of the block coded signal, wherein the memory has a storage capacity of one block and one overlap portion; and
 a decoding module implemented to:
  during a first time:
   process a first block and a first overlap portion corresponding to the first block thereby identifying a first surviving trellis path within the first block from a first plurality of possible trellis paths within the first block; and
   based on the first surviving path, generate and output estimates of bits within the first block; and
  during a second time:
   process a second block and a second overlap portion corresponding to the second block thereby identifying a second surviving trellis path within the second block from a second plurality of possible trellis paths within the second block; and
   based on the second surviving path, generate and output estimates of bits within the second block.

2. The decoder of claim 1, wherein:
the first overlap portion corresponding to the first block includes at least one bit of the second block.

3. The decoder of claim 1, wherein:
the decoding module employs an estimate of a last bit within the first block when identifying the second surviving trellis path within the second block.

4. The decoder of claim 1, wherein:
the decoding module employs a state of a final trellis stage of the first surviving trellis path within the first block as a state of an initial trellis stage of the second surviving trellis path within the second block.

5. The decoder of claim 1, wherein:
the first block and the second block have a same size.

6. The decoder of claim 1, wherein:
the block coded signal also included a third block and a fourth block;
the third block is interposed between the first block and the second block;
the fourth block follows the second block;
the decoding module implemented to:
during the first time:
also process the third block thereby identifying a third surviving trellis path within the third block from a third plurality of possible trellis paths within the third block; and
based on the first surviving path and the third surviving path, generate and output estimates of bits within both the first block and the third block; and
during a second time:
also process the fourth block thereby identifying a fourth surviving trellis path within the fourth block from a fourth plurality of possible trellis paths within the fourth block; and
based on the second surviving path and the fourth surviving path, generate and output estimates of bits within both the second block and the fourth block.

7. The decoder of claim 1, wherein:
the memory is implemented using static random access memory (SRAM).

8. The decoder of claim 1, wherein:
at least one of first data block and the second data block includes at least one a preamble, a synchronization mark field, user data, and a post-amble.

9. The decoder of claim 1, wherein:
the decoder is implemented within an apparatus that includes a hard disk drive (HDD); and
the block coded signal is read from storage media of the HDD.

10. The decoder of claim 1, wherein:
the decoder is implemented within a communication device that receives the block coded signal; and
the communication device is implemented within at least one of a satellite communication system, a wireless communication system, a wired communication system, and a fiber-optic communication system.

11. A decoder implemented to perform sliding traceback decoding of a block coded signal, the decoder comprising:
a memory, implemented using static random access memory (SRAM), that stores blocks of the block coded signal and overlap portions corresponding to the blocks of the block coded signal, wherein the memory has a storage capacity of one block and one overlap portion; and
a decoding module implemented to:
during a first time:
process a first block and a first overlap portion corresponding to the first block thereby identifying a first surviving trellis path within the first block from a first plurality of possible trellis paths within the first block; and
based on the first surviving path, generate and output estimates of bits within the first block; and
during a second time:
process a second block and a second overlap portion corresponding to the second block thereby identifying a second surviving trellis path within the second block from a second plurality of possible trellis paths within the second block; and
based on the second surviving path, generate and output estimates of bits within the second block; and
wherein:
the first overlap portion corresponding to the first block includes at least one bit of the second block; and
the decoding module employs a state of a final trellis stage of the first surviving trellis path within the first block as a state of an initial trellis stage of the second surviving trellis path within the second block.

12. The decoder of claim 11, wherein:
the decoding module employs an estimate of a last bit within the first block when identifying the second surviving trellis path within the second block.

13. The decoder of claim 11, wherein:
at least one of first data block and the second data block includes at least one a preamble, a synchronization mark field, user data, and a post-amble.

14. The decoder of claim 11, wherein:
the decoder is implemented within an apparatus that includes a hard disk drive (HDD); and
the block coded signal is read from storage media of the HDD.

15. The decoder of claim 11, wherein:
the decoder is implemented within a communication device that receives the block coded signal; and
the communication device is implemented within at least one of a satellite communication system, a wireless communication system, a wired communication system, and a fiber-optic communication system.

16. A method for performing sliding traceback decoding of a block coded signal, the method comprising:
storing blocks of the block coded signal and overlap portions corresponding to the blocks of the block coded signal within a memory that has a storage capacity of one block and one overlap portion;
during a first time:
processing a first block and a first overlap portion corresponding to the first block thereby identifying a first surviving trellis path within the first block from a first plurality of possible trellis paths within the first block; and
based on the first surviving path, generating and outputting estimates of bits within the first block; and
during a second time:
processing a second block and a second overlap portion corresponding to the second block thereby identifying a second surviving trellis path within the second block from a second plurality of possible trellis paths within the second block; and based on the second surviving path, generating and outputting estimates of bits within the second block; and employing a state of a final trellis stage of the first surviving trellis path within the first block as a state of an initial trellis stage of the second surviving trellis path within the second block.

17. The method of claim 16, wherein:

the first overlap portion corresponding to the first block includes at least one bit of the second block.

18. The method of claim 16, wherein:

the first block and the second block have a same size; and
the memory is implemented using static random access memory (SRAM).

19. The method of claim 16, further comprising:

reading the block coded signal from storage media of a hard disk drive (HDD).

20. The method of claim 16, further comprising:

receiving the block coded signal from a communication channel; and the communication channel is implemented within at least one of a satellite communication system, a wireless communication system, a wired communication system, and a fiber-optic communication system.

* * * * *